(12) United States Patent
Shimizu et al.

(10) Patent No.: US 9,391,044 B2
(45) Date of Patent: Jul. 12, 2016

(54) PRINTED WIRING BOARD AND METHOD FOR MANUFACTURING PRINTED WIRING BOARD

(71) Applicant: IBIDEN CO., LTD., Ogaki (JP)

(72) Inventors: Keisuke Shimizu, Ogaki (JP); Yuichi Nakamura, Ogaki (JP); Tsuyoshi Yamaguchi, Ogaki (JP)

(73) Assignee: IBIDEN CO., LTD., Ogaki (JP)

( * ) Notice: Subject to any disclaimer, the term of this patent is extended or adjusted under 35 U.S.C. 154(b) by 0 days.

(21) Appl. No.: 14/446,475

(22) Filed: Jul. 30, 2014

(65) Prior Publication Data

US 2015/0034374 A1 Feb. 5, 2015

(30) Foreign Application Priority Data

Jul. 30, 2013 (JP) ................. 2013-157558

(51) Int. Cl.
*H05K 1/09* (2006.01)
*H01L 23/00* (2006.01)
(Continued)

(52) U.S. Cl.
CPC ............... *H01L 24/83* (2013.01); *H05K 1/187* (2013.01); *H05K 3/4682* (2013.01); *H01L 2224/27464* (2013.01); *H01L 2224/32225* (2013.01); *H01L 2224/8385* (2013.01); *H01L 2224/83192* (2013.01); *H01L 2924/01029* (2013.01); *H01L 2924/12042* (2013.01); *H01L 2924/13091* (2013.01); *H01L 2924/14* (2013.01);
(Continued)

(58) Field of Classification Search
CPC ............. H05K 1/16; H05K 1/18; H05K 3/00; H05K 3/10; H05K 3/20; H05K 3/30; H05K 7/00; H05K 7/02; H01L 21/00; H01L 21/02; H01L 21/48; H01L 21/50; H01L 21/56; H01L 21/768; H01L 23/04; H01L 23/13; H01L 23/48; H01L 23/50; H01L 23/58; H01L 23/498; H01L 23/522
USPC ................ 174/257, 255, 256, 258, 260, 262; 361/735, 760–764, 766, 767, 782, 783, 361/812; 257/369, 676, 685, 698, 723, 734, 257/762, 774, 780, 797; 438/110, 126, 424, 438/689; 29/832, 852, 849
See application file for complete search history.

(56) References Cited

U.S. PATENT DOCUMENTS

| | | | |
|---|---|---|---|
| 2003/0094693 A1* | 5/2003 | Fang ..................... | H01L 21/563 257/723 |
| 2004/0014317 A1* | 1/2004 | Sakamoto ............ | H01L 21/568 438/689 |

(Continued)

FOREIGN PATENT DOCUMENTS

JP 2012-191204 10/2012

*Primary Examiner* — Xiaoliang Chen
(74) *Attorney, Agent, or Firm* — Oblon, McClelland, Maier & Neustadt, L.L.P

(57) ABSTRACT

A printed wiring board includes a first insulation layer, an electronic component built into the first insulation layer, a second insulation layer having a via conductor and formed on a first surface of the first insulation layer, and a conductive film formed on the first insulation layer on the opposite side with respect to the first surface of the first insulation layer such that the conductive film is positioned to face a back surface of the electronic component. The first insulation layer has a coefficient of thermal expansion which is set higher than a coefficient of thermal expansion of the second insulation layer.

21 Claims, 19 Drawing Sheets

(51) Int. Cl.
 *H05K 1/18* (2006.01)
 *H05K 3/46* (2006.01)
 *H05K 3/00* (2006.01)

(52) U.S. Cl.
 CPC ........ *H05K3/0097* (2013.01); *H05K 2201/068* (2013.01); *H05K 2203/0156* (2013.01); *H05K 2203/1536* (2013.01); *Y10T 29/302* (2015.01)

(56) References Cited

U.S. PATENT DOCUMENTS

| | | | |
|---|---|---|---|
| 2004/0160751 A1* | 8/2004 | Inagaki | H01L 21/4857 361/763 |
| 2005/0157478 A1* | 7/2005 | Inagaki | H01G 4/224 361/763 |
| 2006/0040463 A1* | 2/2006 | Sunohara | H01L 23/5389 438/424 |
| 2006/0120056 A1* | 6/2006 | Sasaki | H01L 23/3107 361/735 |
| 2006/0290009 A1* | 12/2006 | Sugaya | H01L 23/49822 257/780 |
| 2007/0045815 A1* | 3/2007 | Urashima | H05K 1/0231 257/698 |
| 2007/0187771 A1* | 8/2007 | Takaike | H01L 21/568 257/369 |
| 2007/0209831 A1* | 9/2007 | Sakamoto | H01L 21/568 174/262 |
| 2007/0258225 A1* | 11/2007 | Inagaki | H01L 21/4857 361/763 |
| 2008/0055872 A1* | 3/2008 | Inagaki | H01G 4/224 361/760 |
| 2008/0089048 A1* | 4/2008 | Yamano | H01L 23/5384 361/812 |
| 2008/0142255 A1* | 6/2008 | Inagaki | H01L 21/4857 174/260 |
| 2008/0144298 A1* | 6/2008 | Inagaki | H01L 21/4857 361/763 |
| 2008/0148563 A1* | 6/2008 | Sakamoto | H01L 21/568 29/852 |
| 2008/0151522 A1* | 6/2008 | Sakamoto | H01L 21/568 361/783 |
| 2008/0158838 A1* | 7/2008 | Inagaki | H01G 4/224 361/761 |
| 2008/0158841 A1* | 7/2008 | Inagaki | H01G 4/224 361/782 |
| 2008/0169120 A1* | 7/2008 | Inagaki | H01L 21/4857 174/255 |
| 2008/0169123 A1* | 7/2008 | Sakamoto | H01L 21/568 174/257 |
| 2008/0206926 A1* | 8/2008 | Sakamoto | H01L 21/568 438/110 |
| 2008/0230914 A1* | 9/2008 | Sakamoto | H01L 21/568 257/762 |
| 2009/0077796 A1* | 3/2009 | Sakamoto | H01L 21/568 29/832 |
| 2009/0218118 A1* | 9/2009 | Tani | H01L 23/5389 174/256 |
| 2009/0237900 A1* | 9/2009 | Origuchi | H01L 23/49838 361/763 |
| 2009/0263939 A1* | 10/2009 | Sakamoto | H01L 21/568 438/126 |
| 2010/0014261 A1* | 1/2010 | Inagaki | H01L 21/4857 361/763 |
| 2010/0044845 A1* | 2/2010 | Funaya | H01L 21/6835 257/685 |
| 2010/0072588 A1* | 3/2010 | Yang | H01L 23/49816 257/676 |
| 2010/0118502 A1* | 5/2010 | Inagaki | H01G 4/224 361/766 |
| 2010/0140803 A1* | 6/2010 | Sakamoto | H01L 21/568 257/762 |
| 2010/0226108 A1* | 9/2010 | Inagaki | H01L 21/4857 361/762 |
| 2010/0236821 A1* | 9/2010 | Park | H01L 21/6835 174/260 |
| 2010/0328915 A1* | 12/2010 | Inagaki | H01L 21/4857 361/764 |
| 2011/0155433 A1* | 6/2011 | Funaya | H01L 24/24 174/258 |
| 2012/0006469 A1* | 1/2012 | Inagaki | H01L 21/4857 156/182 |
| 2013/0107482 A1* | 5/2013 | Inagaki | H01G 4/224 361/763 |
| 2013/0286615 A1* | 10/2013 | Inagaki | H01L 21/4857 361/767 |

\* cited by examiner

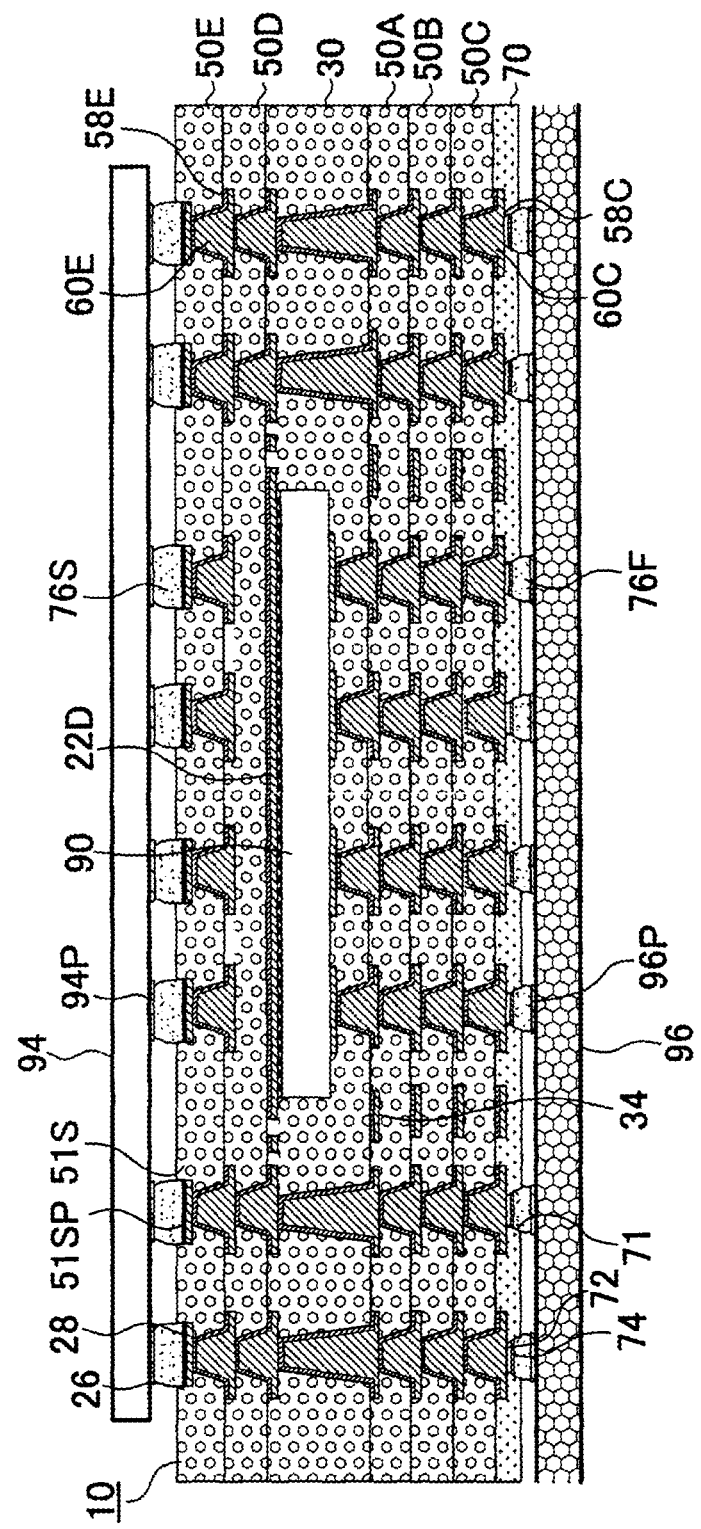

PRINTED WIRING BOARD AND METHOD FOR MANUFACTURING PRINTED WIRING BOARD

CROSS-REFERENCE TO RELATED APPLICATIONS

The present application is based upon and claims the benefit of priority to Japanese Patent Application No. 2013-157558, filed Jul. 30, 2013, the entire contents of which are incorporated herein by reference.

BACKGROUND OF THE INVENTION

1. Field of the Invention

The present invention relates to a printed wiring board with a built-in electronic component and to a method for manufacturing such a printed wiring board.

2. Description of Background Art

JP 2012-191204A describes a method for embedding an electronic component in an insulation layer without using a core substrate so as to obtain a thinner wiring board. JP 2012-191204A describes a method for manufacturing a semiconductor device which includes mounting an electronic component on a support board, embedding in an insulation layer the electronic component on the support board, and removing the support board. The entire contents of this publication are incorporated herein by reference.

SUMMARY OF THE INVENTION

According to one aspect of the present invention, a printed wiring board includes a first insulation layer, an electronic component built into the first insulation layer, a second insulation layer having a via conductor and formed on a first surface of the first insulation layer, and a conductive film formed on the first insulation layer on the opposite side with respect to the first surface of the first insulation layer such that the conductive film is positioned to face a back surface of the electronic component. The first insulation layer has a coefficient of thermal expansion which is set higher than a coefficient of thermal expansion of the second insulation layer.

According to another aspect of the present invention, a method for manufacturing a printed wiring board includes forming copper layer portions on a support board having a copper foil, forming a conductive film and an external connection pad on the copper layer portions formed on the copper foil, respectively, mounting a semiconductor component on the conductive film such that a back side of the semiconductor component is adhered to the conductive film via an adhesive agent, forming a first insulation layer on the support board such that the semiconductor component is embedded in the first insulation layer, forming a first via conductor in the first insulation layer such that the first via conductor connects to an electrode of the semiconductor component, forming a second insulation layer having a second via conductor on the first insulation layer, separating the support board from the first insulation layer such that a laminated structure comprising the first insulation layer, the semiconductor component built in the first insulation layer and the second insulation layer formed on the first insulation layer is removed from the support board, and removing the copper foil and the copper layer portions such that the conductive film and the external connection pad are exposed.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 17 is an applied example of a printed wiring board of the second embodiment;

DETAILED DESCRIPTION OF THE EMBODIMENTS

Figure 1:
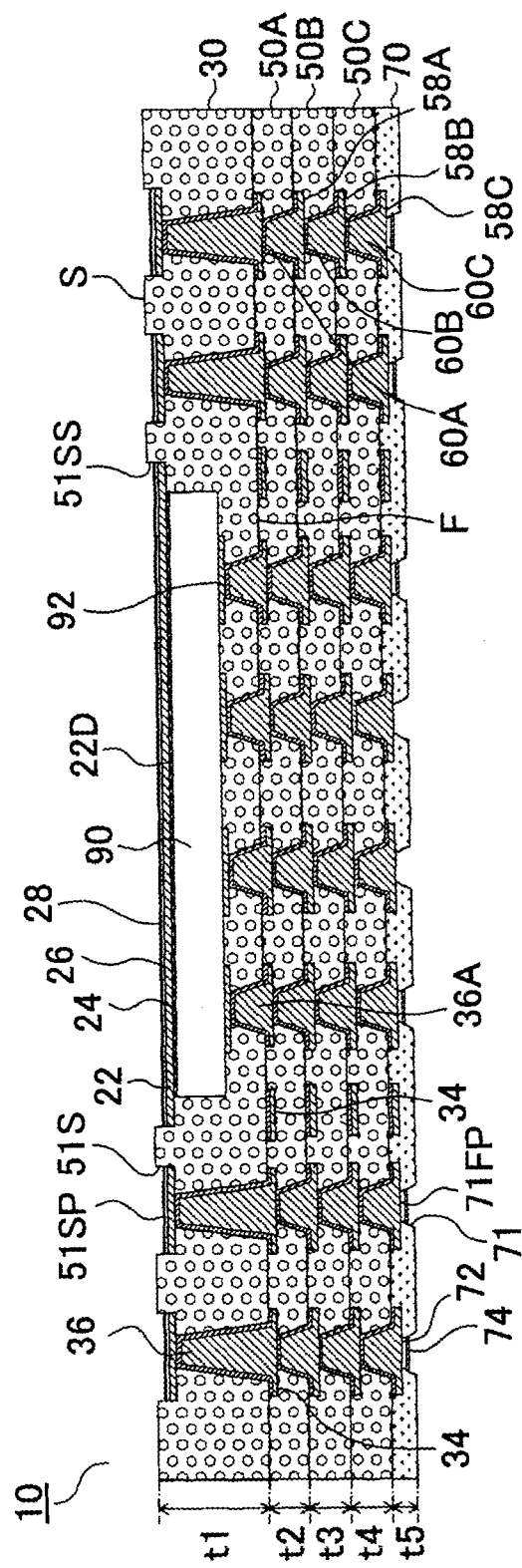
FIG. 1 is a cross-sectional view of a printed wiring board according to a first embodiment of the present invention.

The embodiments will now be described with reference to the accompanying drawings, wherein like reference numerals designate corresponding or identical elements throughout the various drawings.

First Embodiment

A printed wiring board according to a first embodiment of the present invention is described below with reference to FIGS. 1 and 2.

FIG. 1 is a cross-sectional view of printed wiring board 10 according to the first embodiment. FIG. 2 shows a usage example of the printed wiring board of the first embodiment.

Figure 2:
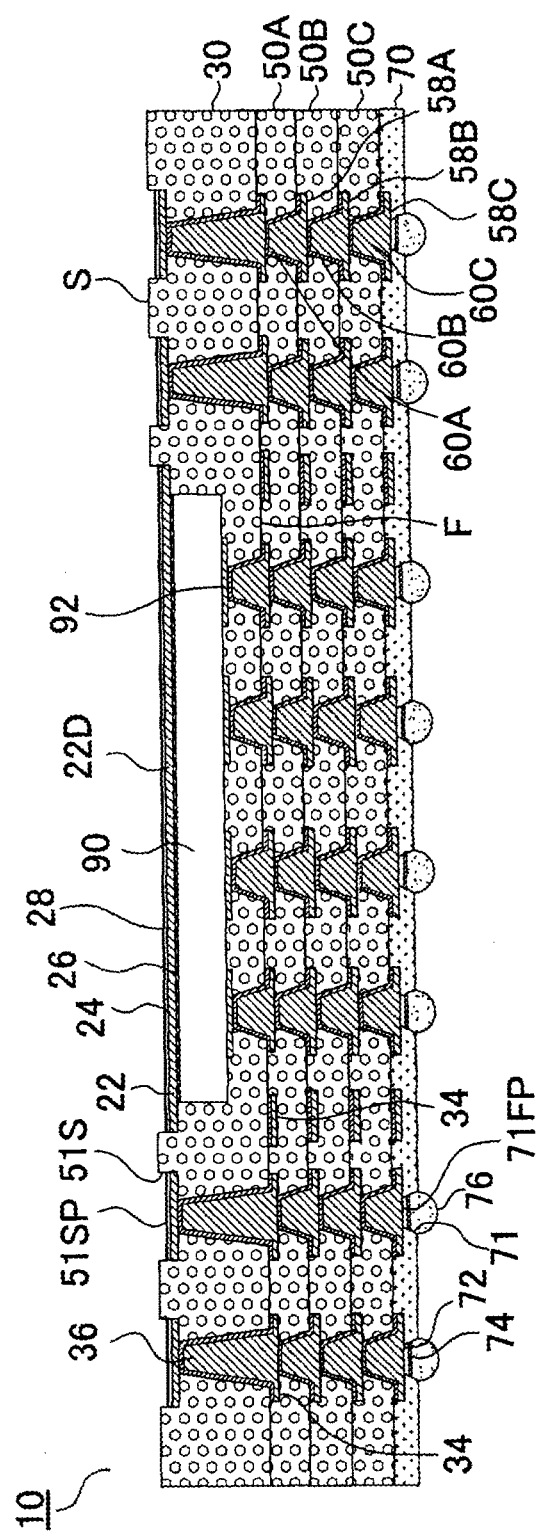
FIG. 2 is an applied example of the printed wiring board in FIG. 1.

In FIG. 2, solder bump 76 is formed on pad (71FP) of the printed wiring board shown in FIG. 1.

As shown in FIG. 1, printed wiring board 10 has the following: outermost first resin insulation layer 30, which accommodates IC chip 90 with a redistribution wiring layer and which has main surface (F) and secondary surface (S) opposite the main surface; pad (51SP) on the secondary-surface side of first resin insulation layer 30; first conductive layer 34 on main surface (F) of the first resin insulation layer; second resin insulation layer (50A) on the main surface of first resin insulation layer 30; second conductive layer (58A) on second resin insulation layer (50A); third resin insulation layer (50B) on second resin insulation layer (50A) and on second conductive layer (58A); third conductive layer (58B) on third resin insulation layer (50B); outermost fourth resin insulation layer (50C) on third resin insulation layer (50B) and on third conductive layer (58B); and outermost fourth conductive layer (58C) on outermost fourth resin insulation layer (50C). On the back surface of IC chip 90, conductive film (22D) is formed with adhesive agent 24 disposed in between. Instead of an adhesive agent, die-attach paste or die-attach film made of silver paste or the like, or a conductive adhesive agent may be used. Pad (51SP) is formed in a position recessed from the secondary surface of first resin insulation layer 30. Pad (51SP) and first conductive layer 34 are connected by via conductor 36 penetrating through the first resin insulation layer. Electrode 92 of the IC chip and first conductive layer 34 are connected by connection via conductor (36A). First conductive layer 34 and second conductive layer (58A) are connected by via conductor (60A) penetrating through the second resin insulation layer. Second conductive layer (58A) and third conductive layer (58B) are connected by via conductor (60B) penetrating through third resin insulation layer (50B). Third conductive layer (58B) and fourth conductive layer (58C) are connected by via conductor (60C) penetrating through fourth resin insulation layer (50C). Solder-resist layer 70 is formed on fourth resin insulation layer (50C). In solder-resist layer 70, opening 71 to expose pad (71FP) is formed, nickel film 72 and gold film 74 are formed on pad (71FP), and solder bump 76 is formed on gold film 74 (see FIG. 2).

In a printed wiring board of the first embodiment, first resin insulation layer 30 is formed to have thickness (t1) at 50 μm; second resin insulation layer (50A) to have thickness (t2) at 30 μm; third resin insulation layer (50B) to have thickness (t3) at 30 μm; fourth resin insulation layer (50C) to have thickness (t4) at 30 μm; and solder-resist layer 70 to have thickness (t5) at 20 μm. Among the above, the thickness of the first resin insulation layer to embed an IC chip is formed to be greatest, and the thickness is preferred to be 50~250 μm. Second resin insulation layer (50A), third resin insulation layer (50B) and fourth resin insulation layer (50C) are made with the same composition, and their CTE (coefficient of thermal expansion) is approximately 10~20 ppm. First resin insulation layer 30 is made with the same resin composition as that of second resin insulation layer (50A), third resin insulation layer (50B) and fourth resin insulation layer (50C) except that its CTE is adjusted by the amount of inorganic filler so as to have a CTE of approximately 30~40 ppm, which is approximately 1.5~3 times the CTE of the second, third and fourth resin insulation layers. The CTE of the solder-resist layer is adjusted to be in the mid-range between the CTE of the first resin insulation layer and the CTE of the second, third and fourth resin insulation layers. The first, second and third resin insulation layers are made of resin containing inorganic particles of a hydroxide or the like. Examples of resin are epoxy resin, BT (bis-maleimide triazine) resin and the like. Inorganic particles of a hydroxide are, for example, metal hydroxides such as aluminum hydroxide, magnesium hydroxide, calcium hydroxide, barium hydroxide and the like. The first, second, third and fourth resin insulation layers do not contain a core material. However, it is an option for the second, third and fourth resin insulation layers to contain a core material (reinforcing material). Examples of a reinforcing material are glass cloth, aramid fiber, fiberglass and the like. The glass is preferred to be T-glass.

In a printed wiring board of the first embodiment, first resin insulation layer 30 with embedded IC chip 90 has a higher CTE than second resin insulation layer (50A), third resin insulation layer (50B) and fourth resin insulation layer (50C) formed on the first resin insulation layer. Since the CTE of the first resin insulation layer 30 is higher, warping occurs in a direction that lowers the peripheral sides of the first resin insulation layer when it is under high temperature, offsetting the warping in a direction that raises the peripheral sides of the second, third and fourth resin insulation layers having a smaller CTE with respect to the CTE of the first resin insulation layer 30. On the other hand, warping occurs in a direction that raises the peripheral sides of the first resin insulation layer when it is under normal temperature, offsetting the warping in a direction that lowers the peripheral sides of the second, third and fourth resin insulation layers having a large CTE. Thus, warping in the printed wiring board is reduced. Accordingly, reliability is enhanced when an IC chip and first printed wiring board are mounted on the printed wiring board.

In a printed wiring board of the first embodiment, since conductive film (22D) is provided on the back surface of IC chip 90, which is on the secondary-surface side of first resin insulation layer 30, the difference decreases between the area of conductors on the secondary-surface side of the first insulation layer, where a smaller amount of conductors is formed, and the area of conductors on the second, third and fourth insulation layers. Accordingly, warping caused by the difference in the areas of conductors is reduced, thus enhancing the reliability of mounting an electronic component or a second printed wiring board on the printed wiring board.

Figure 8:
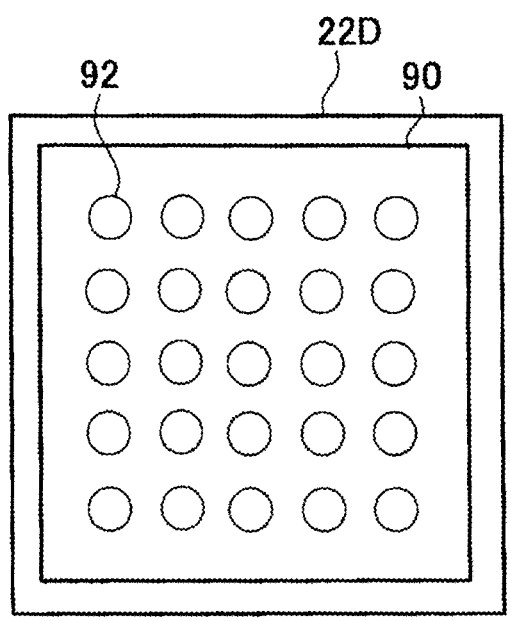
FIG. 8 is a plan view of the conductive film for mounting an IC chip.

FIG. 8 is a plan view of conductive film (22D) for mounting IC chip 90. The area of conductive film (22D) is preferred to be greater than the area of the back surface of IC chip 90. By increasing the area of conductive film (22D), the difference decreases between the area of conductors on the secondary-surface side of the first insulation layer, where a smaller amount of conductors is formed, and the area of conductors on the second, third and fourth insulation layers.

Figure 9:
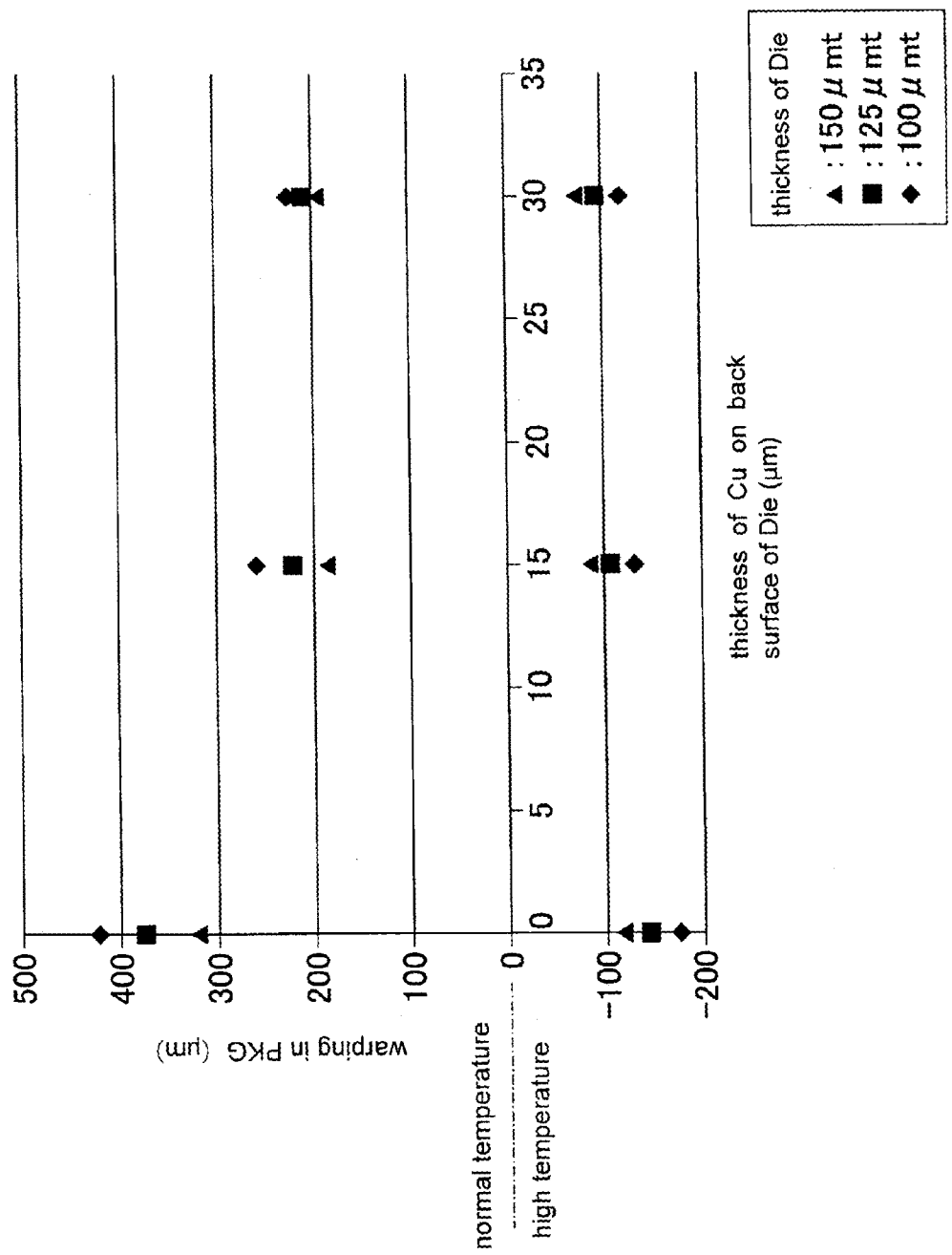
FIG. 9 is a graph showing change in degree of warping in proportion to the thickness of an electronic component and the thickness of conductive film.

FIG. 9 is a graph showing change in warping in proportion to the thickness of the electronic component and the thickness of conductive film (22D). The upper side of the graph shows the degree of warping at normal temperature (25° C.) and the lower side of the graph shows the degree of warping at high temperature (260° C.), when the thickness of the electronic component is set at 150 μm (black triangle), at 125 μm (black rectangle), and at 100 μm (black diamond) respectively. By providing a 15-μm thick conductive film, the degree of warping is reduced compared with a situation where no conductive film (22D) is provided (thickness of 0 μm). Moreover, by providing a 30-μm thick conductive film, the degree of warping is further reduced. Here, the electronic component is preferred to have an approximate thickness of 30~200 μm, and the thickness of conductive film (22D) is preferred to be 5~40 μm.

Adhesive agent 24 is preferred to have a thickness of 3~25 μm. Adhesive agent 24 is preferred to be a non-conductive adhesive agent when the electronic component accommodated in a printed wiring board is a memory or the like that generates less heat, whereas a die-attach film with high heat transmission or a conductive agent is preferable when the electronic component is a power MOSFET or the like for a power supply that generates more heat. Conductive film (22D) can be used as a heat sink. When a non-conductive adhesive agent is used, conductive film (22D) is preferred to be used as a ground layer to stabilize the power source.

In the first embodiment, since pad (51SP) is provided in recess (51S) of the first resin insulation layer, it is not necessary to form a solder-resist layer to prevent short circuiting when solder bumps are formed thereon. Thus, there is no need to form a solder-resist layer with a low CTE on the exposed-surface side of the first resin insulation layer. Accordingly, no solder-resist layer will inhibit the first resin insulation layer from functioning to reduce the degree of warping.

The following is a method for manufacturing a printed wiring board according to the first embodiment described with reference to FIG. 3~7.

Figure 3A:
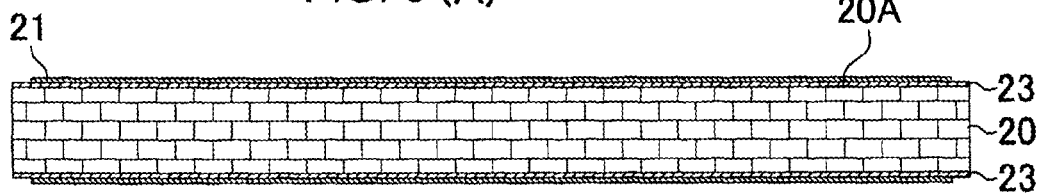
FIG. 3(A)-3(E) are views showing steps for manufacturing a printed wiring board according to the first embodiment.
Figure 3B:
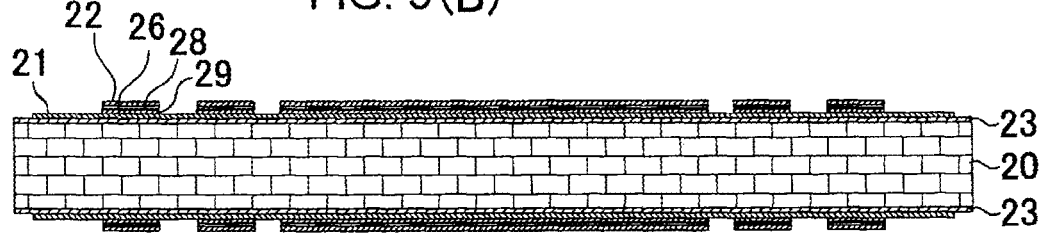

Double-sided copper-clad laminate (20A) formed by laminating copper foils 23 on resin substrate 20, along with copper foil 21 with a thickness of 3~20 μm, is prepared (FIG. 3(A)). Copper foil 21 is bonded to copper foil 23 of the copper-clad laminate by an adhesive agent or by ultrasonic bonding. The copper-clad laminate and the copper foil are bonded at a predetermined width along their peripheries.

Plating resist (not shown) having openings is formed on copper foil 21, and electrolytic plating is performed to form copper layer 29, gold layer 28, nickel layer 26 and copper layer 22 in that order in the openings. Then, the plating resist is removed (FIG. 3(B)).

Figure 3C:
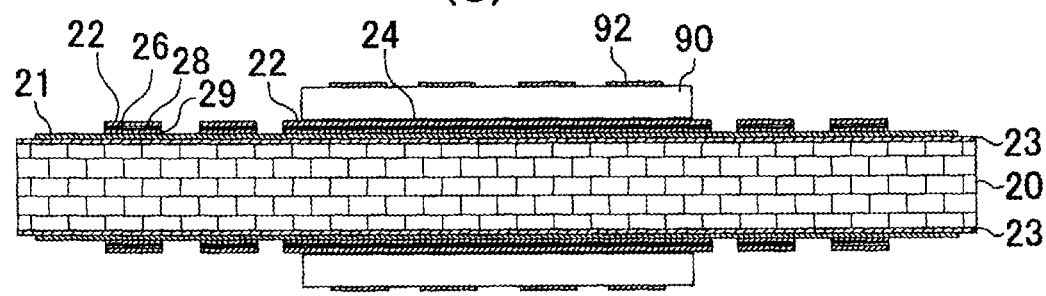

In the IC chip mounting region, IC chip 90 is positioned on copper layer 22 with adhesive agent 24 disposed in between in such a way that the back surface of the IC chip faces double-sided copper-clad laminate (20A) (FIG. 3(C)).

Figure 3D:
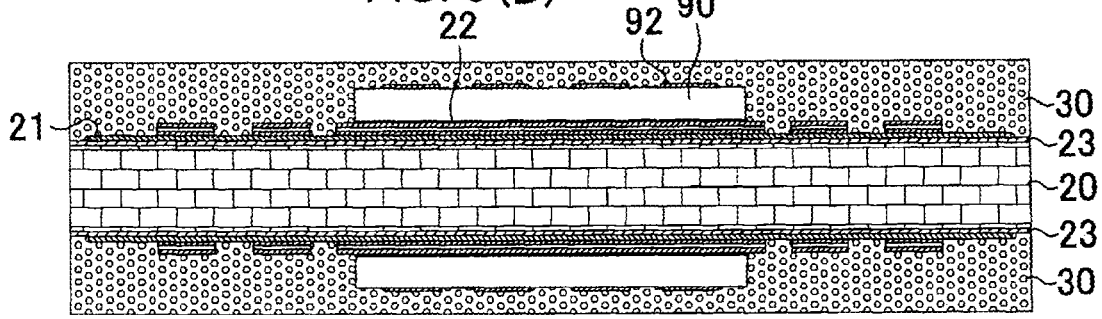

Resin film for forming interlayer resin insulation layers is laminated on copper foil 21 to form first resin insulation layer 30 (FIG. 3(D)).

Figure 3E:
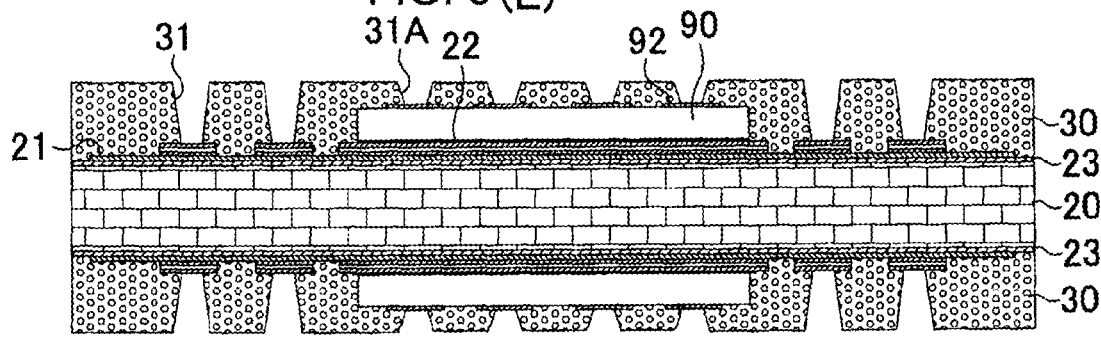

Using a laser, opening 31 reaching copper layer 22 and opening (31A) reaching electrode 92 of the IC chip are formed in first resin insulation layer 30 (FIG. 3(E)).

Figure 4A:
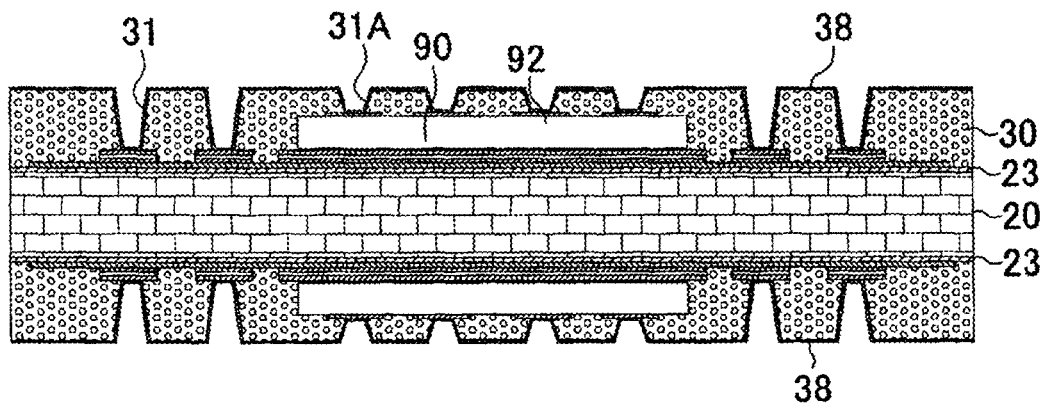
FIG. 4(A)-4(C) are views showing steps for manufacturing a printed wiring board according to the first embodiment.

Electroless plating is performed to form electroless copper-plated film 38 on the surface of first resin insulation layer 30 and in openings (31, 31A) (FIG. 4(A)).

Figure 4B:
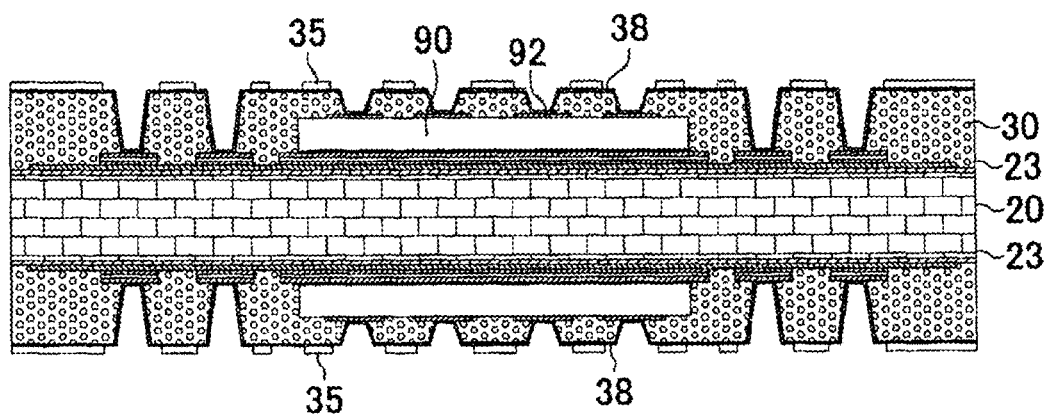

Plating resist 35 with a predetermined pattern is formed on electroless copper-plated film 38 (FIG. 4(B)).

Figure 4C:
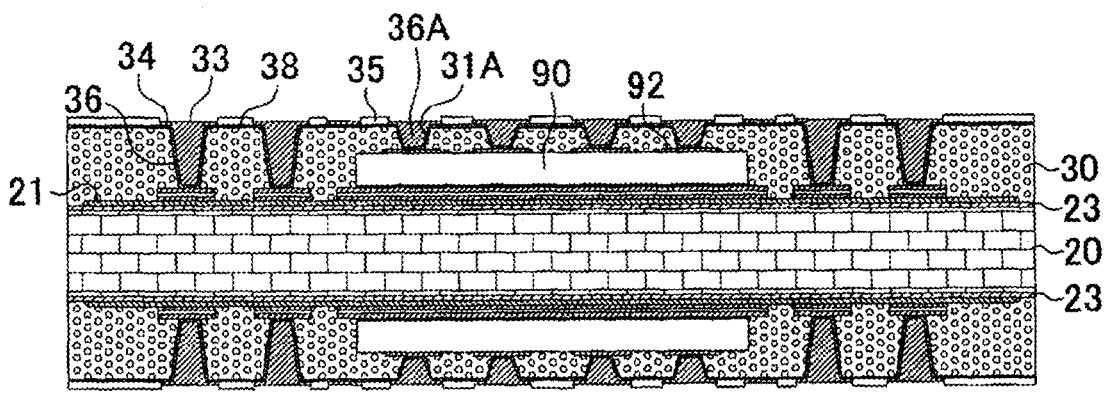

Electrolytic plating is performed to form electrolytic plated film 33 in portions where no plating resist 35 is formed (FIG. 4(C)). At that time, opening 31 is filled with electrolytic plated film to form via conductor 36, and opening (31A) is filled with electrolytic plated film to form connection via conductor (36A).

Figure 5A:
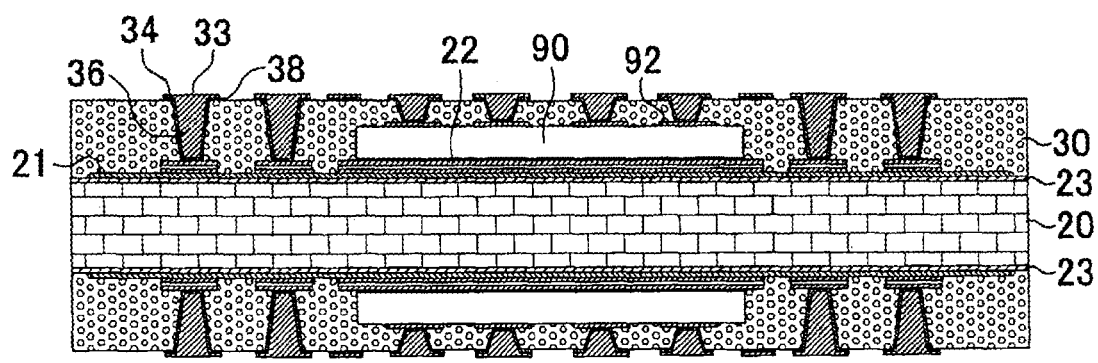
FIG. 5(A)-5(B) are views showing steps for manufacturing a printed wiring board according to the first embodiment.
Figure 5B:
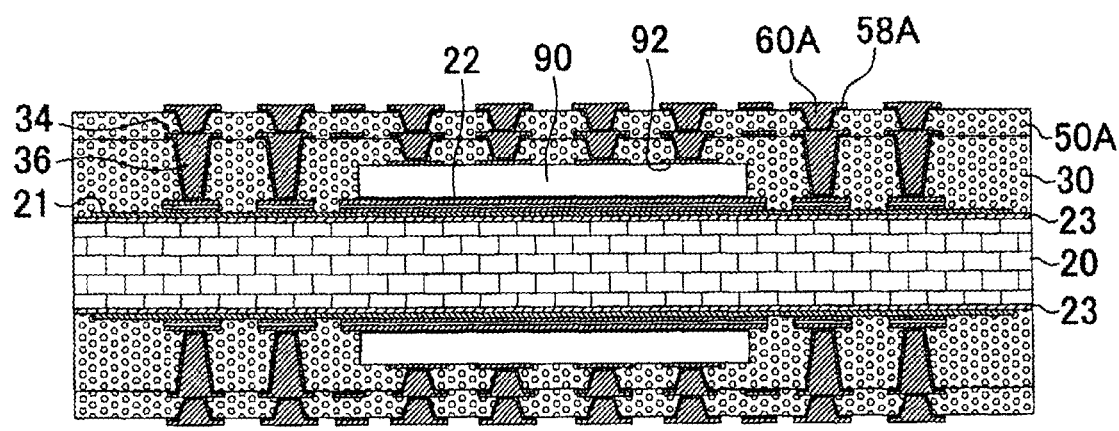
Figure 6A:
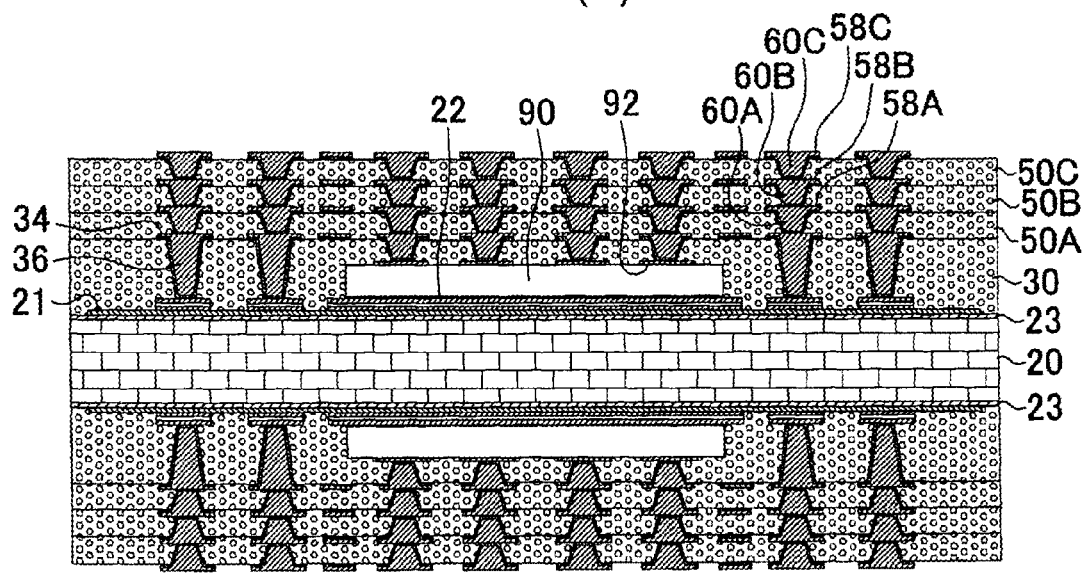
FIG. 6(A)-6(B) are views showing steps for manufacturing a printed wiring board according to the first embodiment.
Figure 6B:
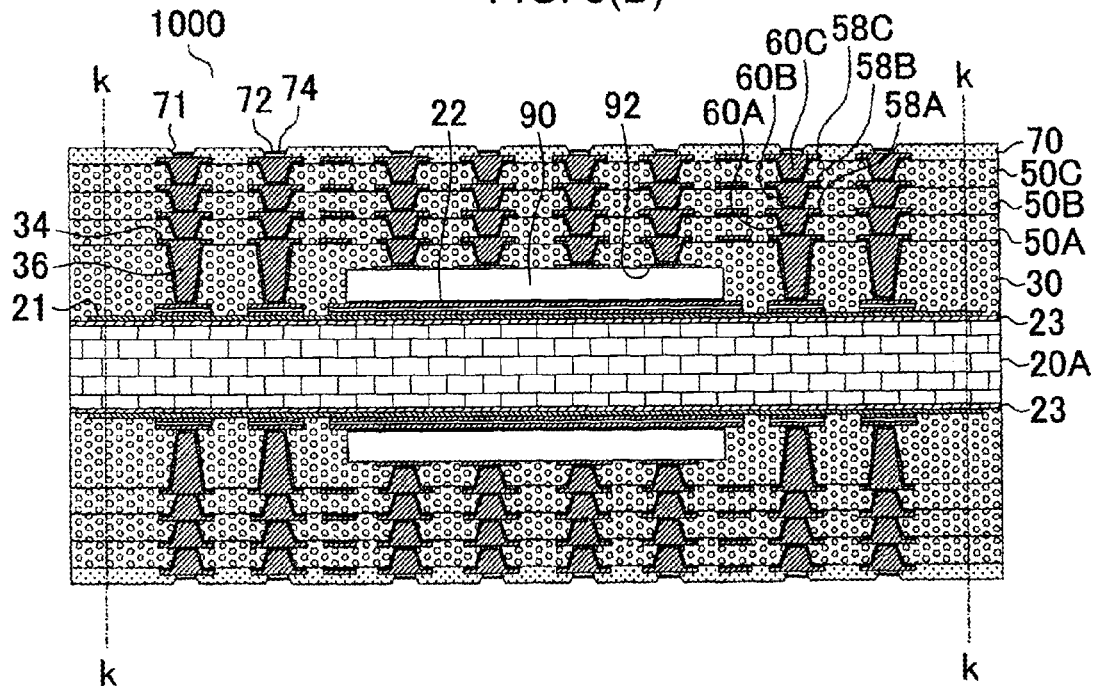

The plating resist is removed, and electroless copper-plated film 38 is removed from portions where no electrolytic plated film is formed so as to form first conductive layer 34 made up of electroless plated film 38 and electrolytic plated film 33 (FIG. 5(A)).

Second resin insulation layer (50A) and second conductive layer (58A) are formed on first resin insulation layer 30 by the same procedures described above with reference to FIG. 3(D)~FIG. 5(A). First conductive layer 34 and second conductive layer (58A) are connected by via conductor (60A) (FIG. 5(B)).

Third resin insulation layer (50B) and third conductive layer (58B) are formed on second resin insulation layer (50A) by the same procedures described above with reference to FIG. 3(D)~FIG. 5(A). Second conductive layer (58A) and third conductive layer (58B) are connected by via conductor (60B).

Fourth resin insulation layer (50C) and fourth conductive layer (58C) are formed on third resin insulation layer (50B) by the same procedures described above with reference to FIG. 3(D)~FIG. 5(A). Third conductive layer (58B) and fourth conductive layer (58C) are connected by via conductor (60C) (FIG. 6(A)).

Solder-resist layer 70 having opening 71 is formed on fourth resin insulation layer (50C). Electroless plating is performed to form Ni film 72 and Au film 74 in opening 71 (FIG. 6(B)). Laminated substrate 1000 is completed. Instead of Ni/Au film, metal film such as Ni/Pd/Au film or Sn film may also be formed.

Figure 7A:
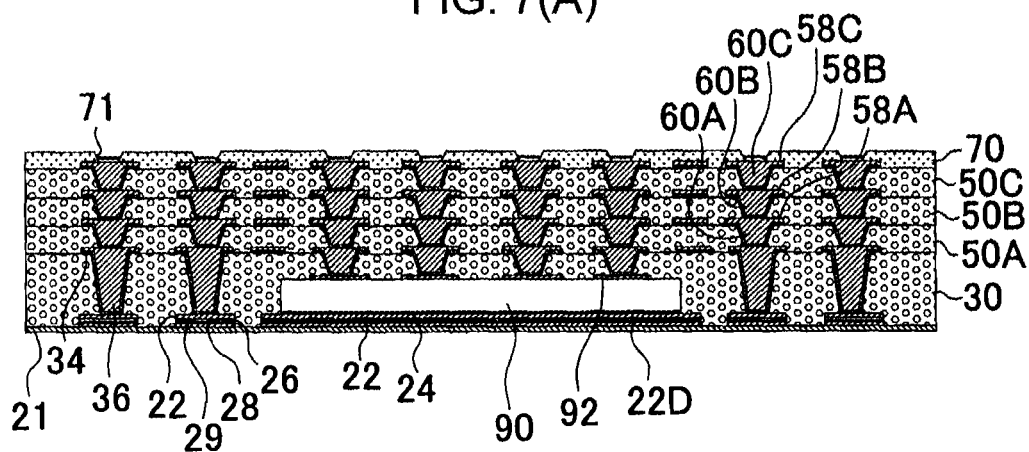
FIG. 7(A)-7(B) are views showing steps for manufacturing a printed wiring board according to the first embodiment.
Figure 7B:
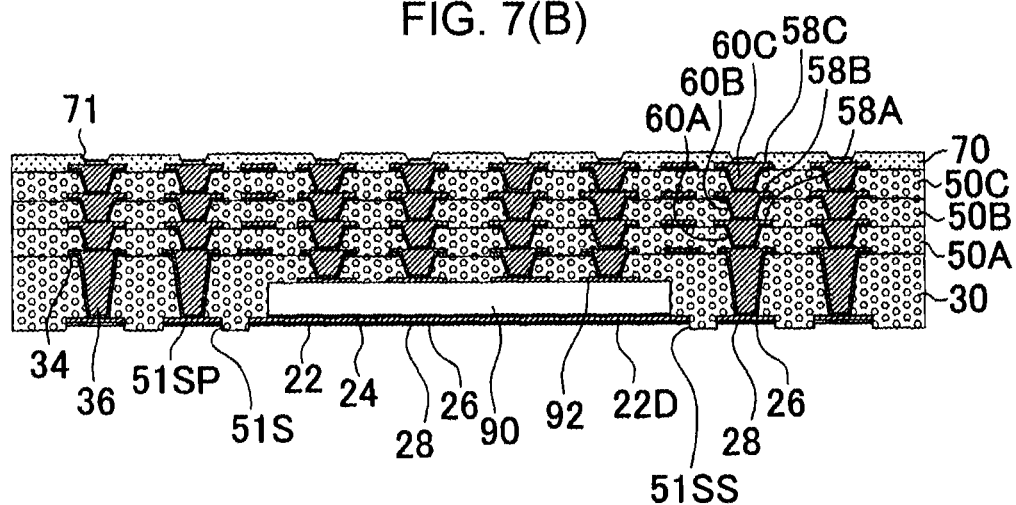

The laminated substrate is cut at (k-k) inside the bonded portion of copper foil 21 and double-sided copper-clad laminate (20A), and double-sided copper-clad laminate (20A) is removed (FIG. 7(A)).

Copper foil 21 and copper layer 29 are removed from laminated substrate 1000 by selective etching. "SF-5420" made by Mec Co., Ltd. may be used as the etching solution. Gold layer 28 is exposed and the gold layer forms pad (51SP), and copper layer 22, nickel layer 26 and gold layer 28 under the IC chip form conductive film (22D) (FIG. 7(B), FIG. 1). In the first resin insulation layer, first recess (51SS) for forming conductive film and second recess (51S) for forming a pad are formed when copper layer 29 is removed. Conductive film (22D) is formed in first recess (51SS) and pad (51SP) is formed in second recess (51S).

Solder bump 76 is formed in opening 71 of solder-resist layer 70 (FIG. 2).

In a printed wiring board according to the first embodiment, pad (51SP) is recessed from secondary surface (S) of first resin insulation layer 30. Thus, short circuiting of solder bumps on adjacent pads is unlikely to occur.

First Modified Example of First Embodiment

Figure 10:
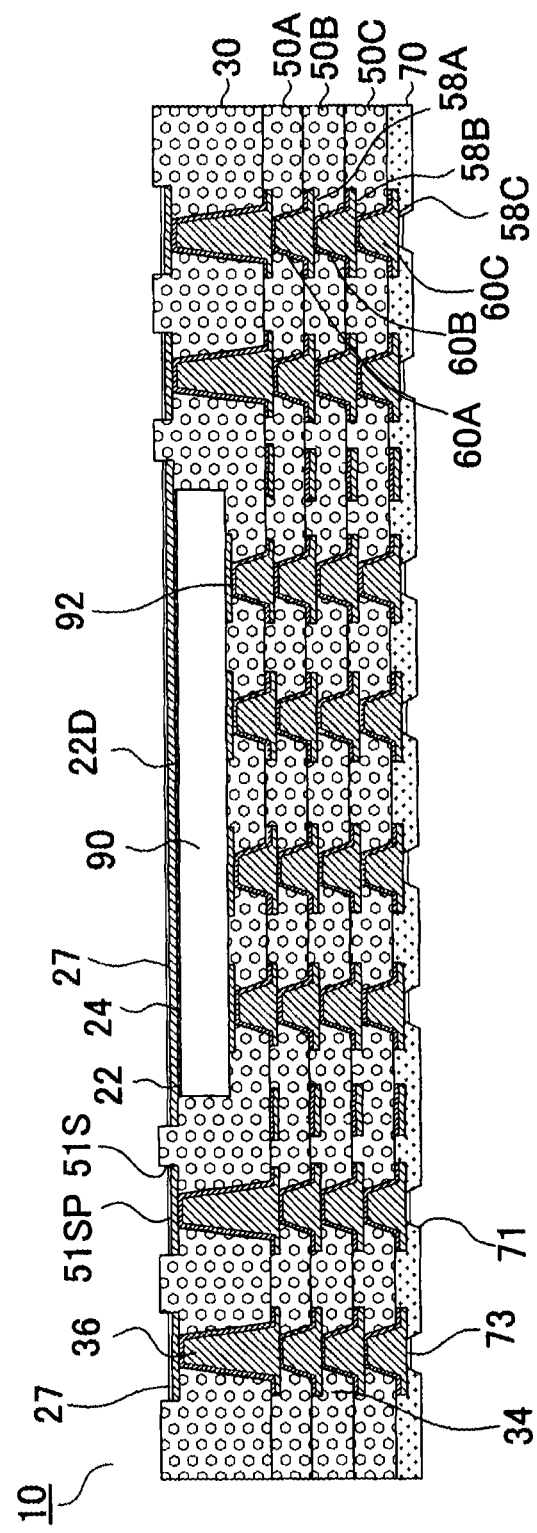
FIG. 10 is a cross-sectional view of a printed wiring board according to a first modified example of the first embodiment.

In the first embodiment, a gold layer was formed on the nickel layer. In a first modified example of the first embodiment, a gold layer is omitted, and copper layer 29, nickel layer 26 and copper layer 22 are formed, and after etching copper layer 29, nickel layer 26 is removed by selective etching to expose copper layer 22. Then, as shown in FIG. 10, OSP 27 (organic film such as heat-resistant water-soluble preflux) is formed on copper layer 22 (pad (51P) and conductive film (22D)). It is easier to form OSP than to form metal film by plating.

Second Modified Example of First Embodiment

Figure 11:
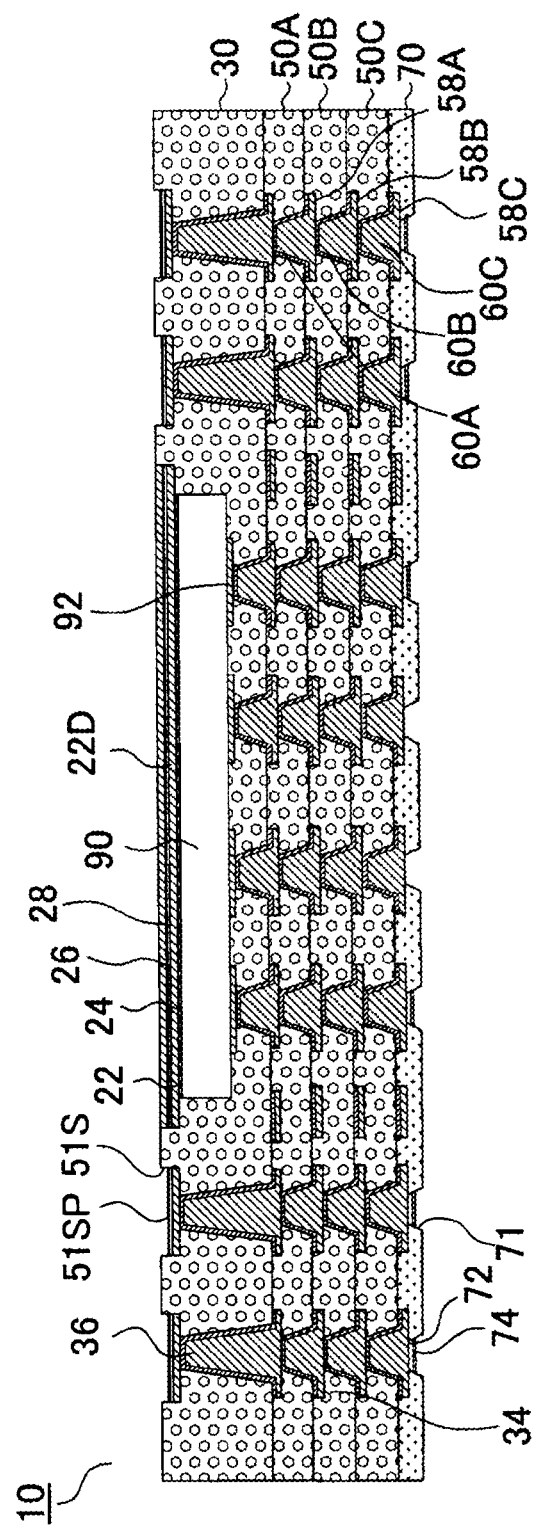
FIG. 11 is a cross-sectional view of a printed wiring board according to a second modified example of the first embodiment.

FIG. 11 is a cross-sectional view of a printed wiring board according to a second modified example of the first embodiment.

In the first embodiment, conductive film (22D) was formed in first recess (51SS) so that the surface of conductive film (22D) is recessed from the secondary surface of first resin insulation layer 30. By contrast, in the second modified example of the first embodiment, the surface of conductive film (22D) is made flush with the secondary surface of first resin insulation layer 30.

Figure 14A:
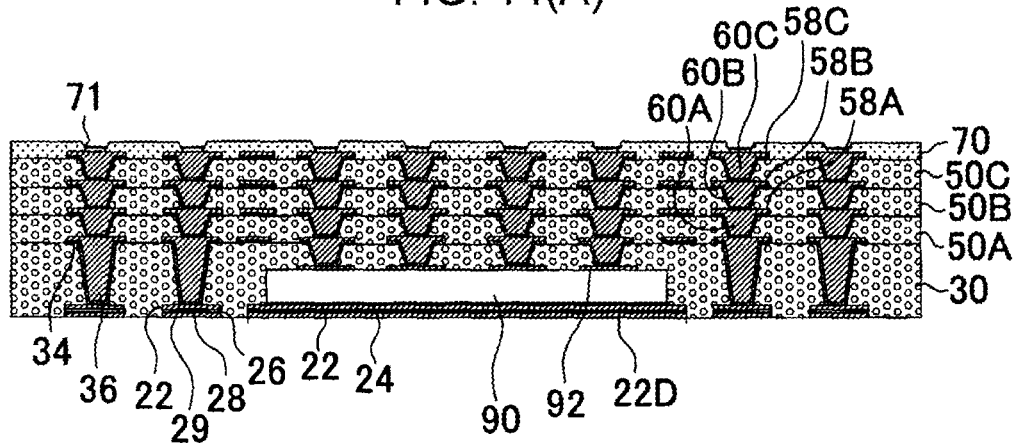
FIG. 14(A)-14(C) are views showing steps for manufacturing a printed wiring board according to the second modified example of the first embodiment.
Figure 14B:
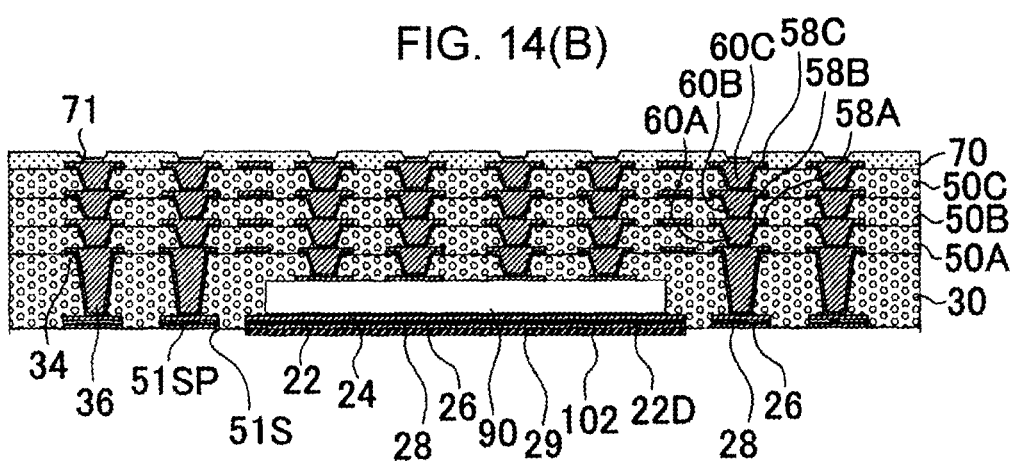
Figure 14C:
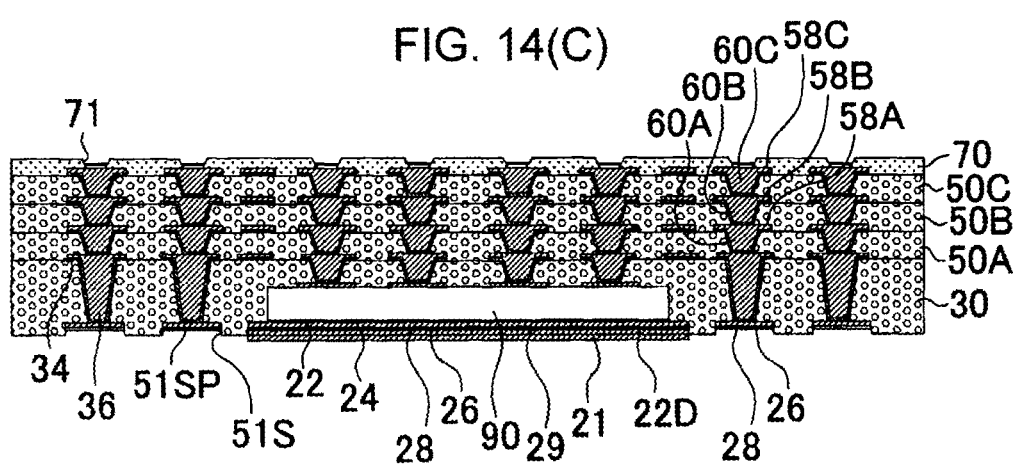

FIG. 14 shows a method for manufacturing a printed wiring board according to the second modified example of the first embodiment. After double-sided copper-clad laminate (20A) has been removed as shown in FIG. 7(A), copper foil 21 is removed by etching (FIG. 14(A)). Etching resist 102 is formed on conductive film (22D) (FIG. 14(B)), copper layer 29 in the pad-forming portion is removed, and pad (51SP) made of gold layer 28 is formed in second recess (51S). In the second modified example of the first embodiment, by increasing the thickness of conductive film (22D), the amount of conductive layer between layers is adjusted. In the second modified example, it is another option to omit the gold layer, and to form conductive film (22D) with a copper-nickel-copper layer, and to perform surface treatment on the exposed copper layer.

Third Modified Example of First Embodiment

Figure 12:
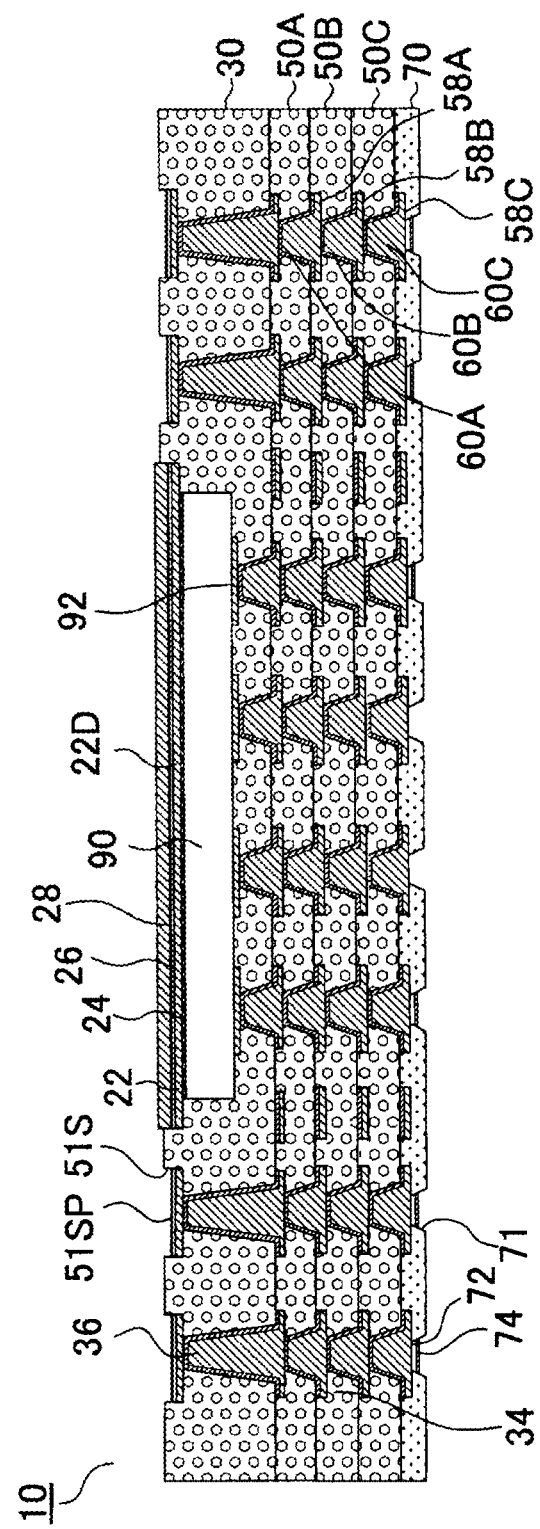
FIG. 12 is a cross-sectional view of a printed wiring board according to a third modified example of the first embodiment.

FIG. 12 is a cross-sectional view of a printed wiring board according to a third modified example of the first embodiment. In the third modified example of the first embodiment, the surface of conductive film (22D) protrudes from the secondary-surface side of first resin insulation layer 30.

Figure 15A:
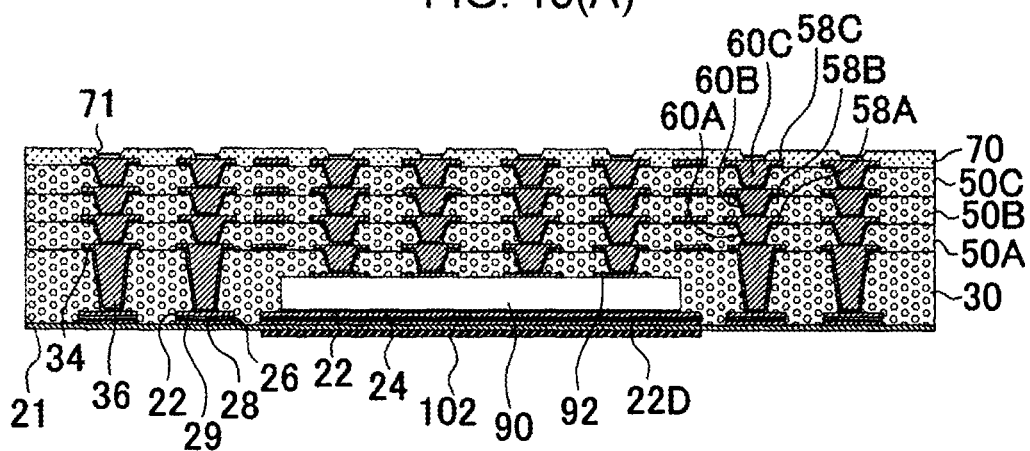
FIG. 15(A)-15(B) are views showing steps for manufacturing a printed wiring board according to the third modified example of the first embodiment.
Figure 15B:
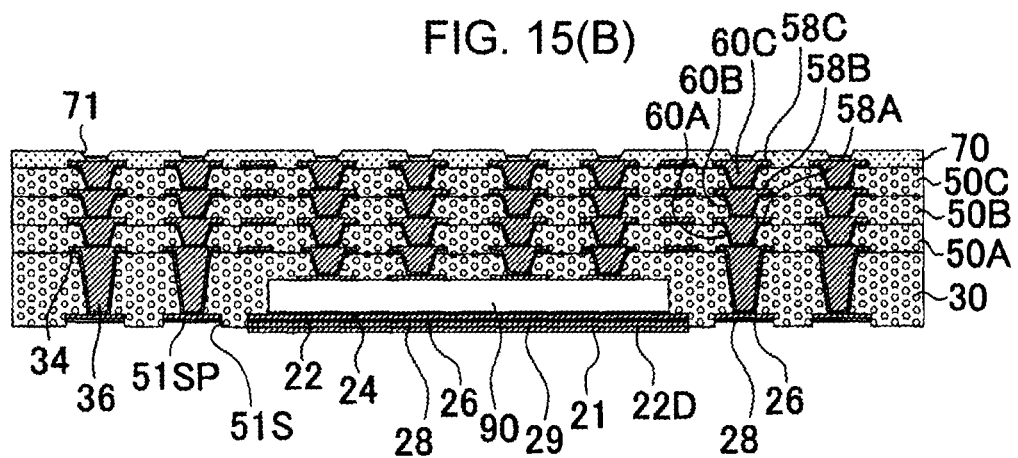

FIG. 15 shows a method for manufacturing a printed wiring board according to the third modified example of the first embodiment. After double-sided copper-clad laminate (20A) has been removed as shown in FIG. 7(A), etching resist 102 is formed on the portion of conductive film (22D) on copper foil 21 (FIG. 15(A)). Then, copper foil 21 where no etching resist is formed and copper layer 29 on a pad-forming portion are removed by etching so as to form pad (51SP) made of gold layer 28 in second recess (51S) (FIG. 15(B)). In the third modified example, the gold layer may be omitted; instead, it is an option to form conductive film (22D) with a copper-nickel-copper layer, and to perform surface treatment on the exposed copper layer.

Fourth Modified Example of First Embodiment

Figure 13:
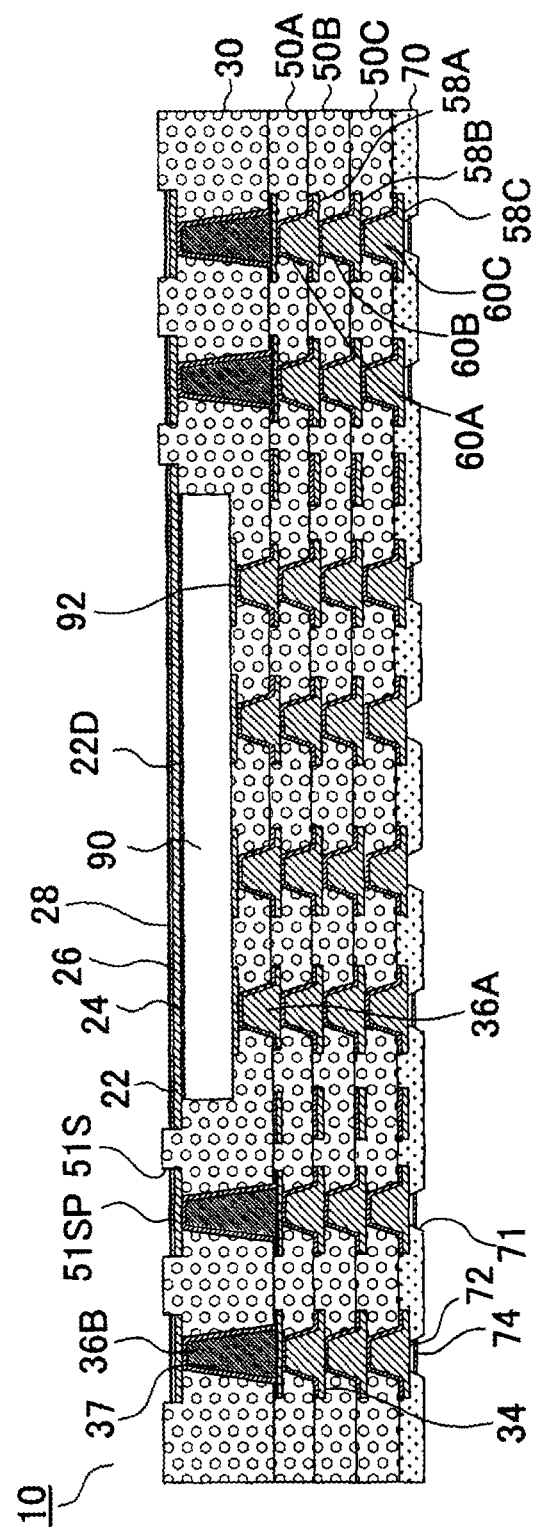
FIG. 13 is a cross-sectional view of a printed wiring board according to a fourth modified example of the first embodiment.

FIG. 13 is a cross-sectional view of a printed wiring board according to a fourth modified example of the first embodiment.

In the first embodiment, via conductor 36 penetrating through first resin insulation layer 30 is formed by filling plating. By contrast, in the fourth modified example of the first embodiment, resin 37 is filled in via conductor (36B) penetrating through first resin insulation layer 30. In the fourth modified example of the first embodiment, only via conductor (36B) that penetrates through thick first resin insulation layer 30 is filled with resin so that its rigidity is balanced with connection via conductor (36A) in the same layer and with via conductors (60A, 60B, 60C) in other layers. Accordingly, the degree of warping is reduced.

Second Embodiment

Figure 16:
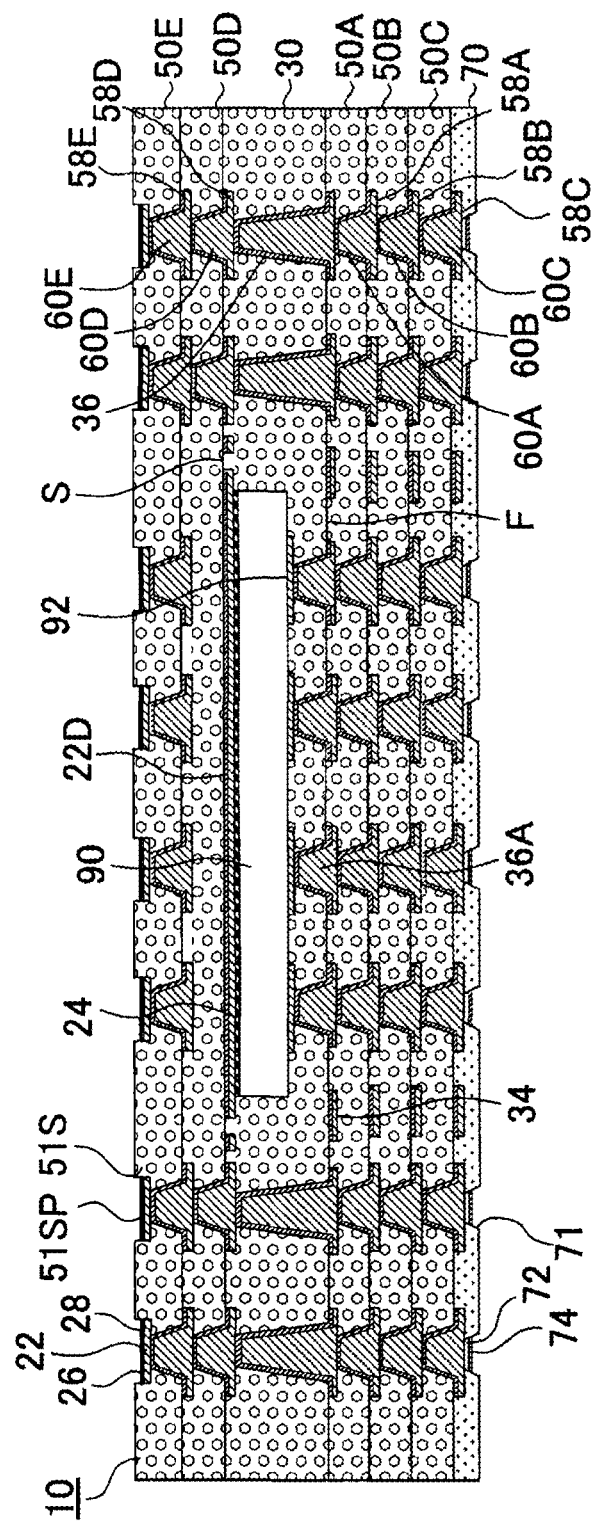
FIG. 16 is a cross-sectional view of a printed wiring board according to a second embodiment of the present invention.

FIG. 16 is a cross-sectional view of a printed wiring board according to a second embodiment. FIG. 17 shows a usage example of a printed wiring board of the second embodiment. In FIG. 17, printed wiring board 10 is mounted on motherboard 96 through solder bump (76F) and pad (96P) of the printed wiring board shown in FIG. 1, and memory chip 94 is mounted on pad (51SP) of printed wiring board 10 through solder bump (76S) and pad (94P).

As shown in FIG. 16, printed wiring board 10 has the following: first resin insulation layer 30 which accommodates IC chip 90 with a redistribution wiring layer and which has main surface (F) and secondary surface (S) opposite the main surface; first conductive layer 34 on main surface (F) of the first resin insulation layer; second resin insulation layer (50A) on the main surface of first resin insulation layer 30; second conductive layer (58A) on second resin insulation layer (50A); third resin insulation layer (50B) on second resin insulation layer (50A) and on second conductive layer (58A); third conductive layer (58B) on third resin insulation layer (50B); outermost fourth resin insulation layer (50C) on third resin insulation layer (50B) and on third conductive layer (58B); and outermost fourth conductive layer (58C) on outermost fourth resin insulation layer (50C). On the back surface of IC chip 90, conductive film (22D) is formed with adhesive agent 24 disposed in between.

On the secondary-surface side of first resin insulation layer 30, the printed wiring board has fifth conductive layer (58D), fifth resin insulation layer (50D) on the secondary surface of first resin insulation layer 30, sixth conductive layer (58E) on fifth resin insulation layer (50D), and sixth resin insulation layer (50E) on fifth resin insulation layer (50D) and on sixth conductive layer (58E). Recess (51S) to expose pad (51SP) is formed in sixth resin insulation layer (50E). Pad (51SP) and sixth conductive layer (58E) are connected by via conductor (60E) penetrating through the sixth resin insulation layer. Sixth conductive layer (58E) and fifth conductive layer (58D) are connected by via conductor (60D) penetrating through the fifth resin insulation layer. Fifth conductive layer (58D) and first conductive layer 34 are connected by via conductor 36 penetrating through the first resin insulation layer. Electrode 92 of the IC chip and first conductive layer 34 are connected by connection via conductor (36A). First conductive layer 34 and second conductive layer (58A) are connected by via conductor (60A) penetrating through the second resin insulation layer. Second conductive layer (58A) and third conductive layer (58B) are connected by via conductor (60B) penetrating through third resin insulation layer (50B). Third conductive layer (58B) and fourth conductive layer (58C) are connected by via conductor (60C) penetrating through fourth resin insulation layer (50C). Solder-resist layer 70 is formed on fourth resin insulation layer (50C). Opening 71 to expose pad (71FP) is formed in solder-resist layer 70. Nickel film 72 and gold film 74 are formed on pad (71FP), and solder bump (76F) is formed on gold film 74 (see FIG. 17).

In the second embodiment, second resin insulation layer (50A), third resin insulation layer (50B) and fourth resin insulation layer (50C) are made with the same composition, and their CTE (coefficient of thermal expansion) is approximately 10~20 ppm. First resin insulation layer 30 is made with the same resin composition as that of second resin insulation layer (50A), third resin insulation layer (50B), fourth resin insulation layer (50C), fifth resin insulation layer (50D) and sixth resin insulation layer (50E), except that its CTE is adjusted by the amount of inorganic filler so as to have a CTE of approximately 30~40 ppm, which is approximately 1.5~3 times the CTE of the second, third and fourth resin insulation layers. The CTE of the solder-resist layer and the CTE of fifth resin insulation layer (50D) and sixth resin insulation layer (50E) are adjusted to be in the mid-range between the CTE of the first resin insulation layer and the CTE of the second, third and fourth resin insulation layers.

In a printed wiring board of the second embodiment, first resin insulation layer 30 with embedded IC chip 90 has a higher CTE than second resin insulation layer (50A), third resin insulation layer (50B) and fourth resin insulation layer (50C) formed on the first resin insulation layer. Since the CTE of the first resin insulation layer is higher, warping occurs in a direction that lowers the peripheral sides of the first resin insulation layer when it is under high temperature, offsetting the warping in a direction that raises the peripheral sides of the second, third and fourth resin insulation layers having a smaller CTE with respect to the CTE of the first resin insulation layer 30. On the other hand, warping occurs in a direction that raises the peripheral sides of the first resin insulation layer when it is under normal temperature, offsetting the warping in a direction that lowers the peripheral sides of the second, third and fourth resin insulation layers having a large CTE. Thus, warping in the printed wiring board is reduced. Accordingly, reliability is enhanced when an IC chip and first printed wiring board are mounted on the printed wiring board.

A printed wiring board according to the second embodiment has a buildup layer on the back-surface side of the IC chip. Thus, when an electronic component with numerous connection terminals such as a memory is mounted, flexibility in pad-positioning design is high on the memory side. In addition, a memory of a generic design can be used as is.

FIGS. 18 and 19 show steps in manufacturing a printed wiring board according to the second embodiment.

Figure 18A:
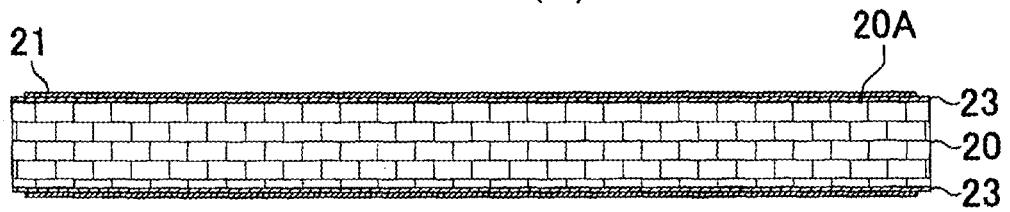
FIG. 18(A)-18(D) are views showing steps for manufacturing a printed wiring board according to the second embodiment.
Figure 18B:
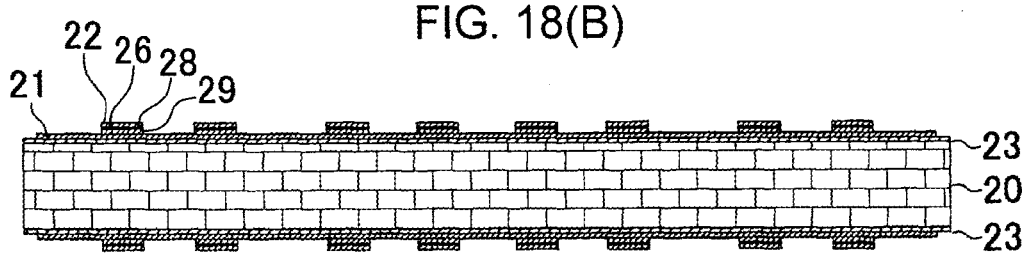
Figure 18C:
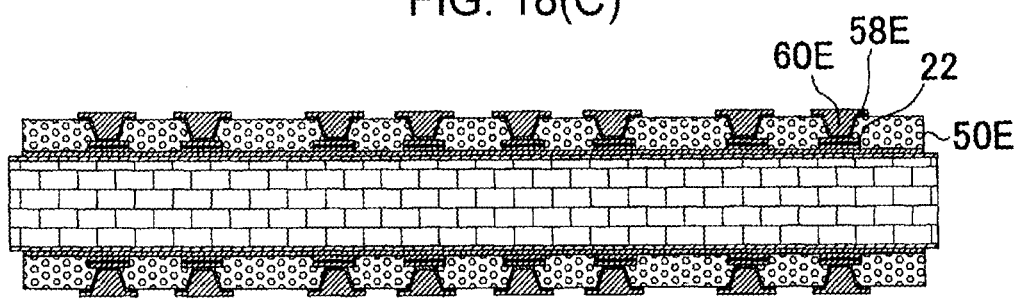
Figure 18D:
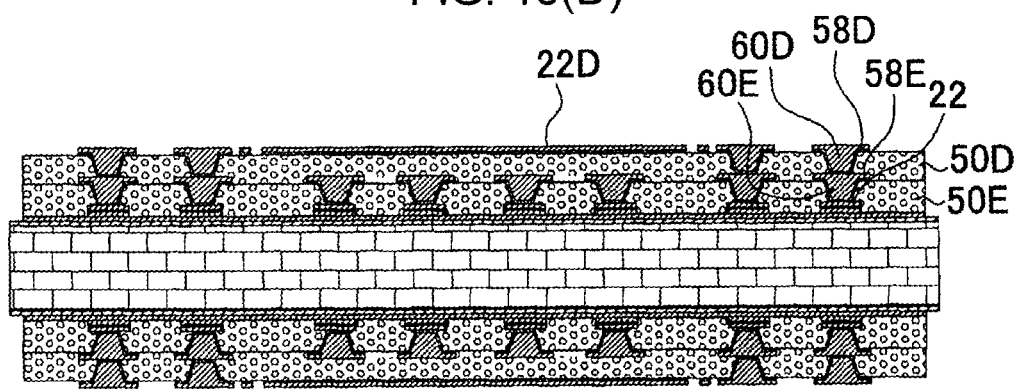

Double-sided copper-clad laminate (20A) with copper foil 23 laminated on resin substrate 20, along with copper foil 21 with a thickness of 3~20 μm, is prepared (FIG. 18(A)). Copper foil 21 is bonded on copper foil 23 of the copper-clad laminate by an adhesive agent or by ultrasonic bonding so that the copper-clad laminate and the copper foil are bonded at a predetermined width along their peripheries.

Plating resist (not shown) with openings is formed on copper foil 21, and electrolytic plating is performed to form copper layer 29, gold layer 28, nickel layer 26 and copper layer 22 in that order in the opening. Then, the plating resist is removed (FIG. 18(B)).

Sixth resin insulation layer (50E) and sixth conductive layer (58E) are formed on copper foil 21 by the same procedures described above with reference to FIG. 3(D)~FIG. 5(A) in the first embodiment. Copper layer 22 and sixth conductive layer (58E) are connected by via conductor (60E) (FIG. 18(C)).

Fifth resin insulation layer (50D), fifth conductive layer (58D) and conductive film (22D) are formed on sixth resin insulation layer (50E) by the same procedures described above with reference to FIG. 3(D)~FIG. 5(A). Sixth conductive layer (58E) and fifth conductive layer (58D) are connected by via conductor (60A) (FIG. 18(D)).

Figure 19A:
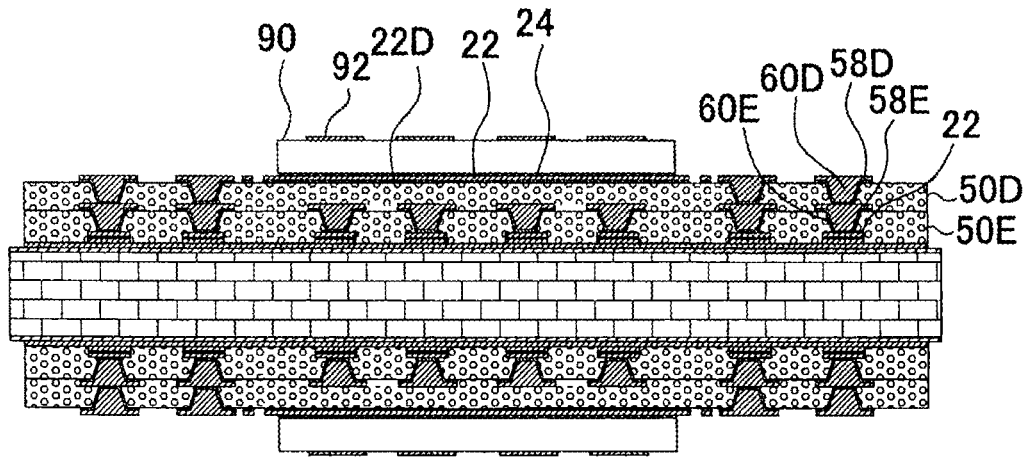
FIG. 19(A)-19(B) are views showing steps for manufacturing a printed wiring board according to the second embodiment.
Figure 19B:
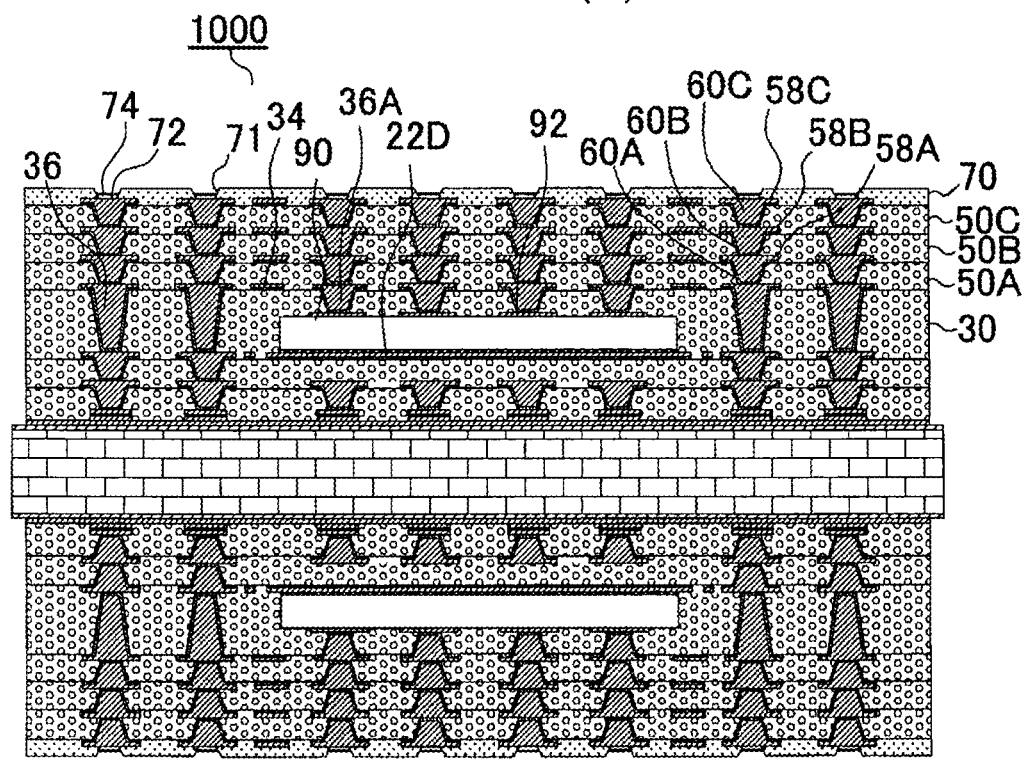

In the IC chip mounting region, IC chip 90 is mounted on conductive film (22D) with adhesive agent 24 disposed in between in such a way that the back surface of the IC chip faces the conductive film (FIG. 19(A)).

By the same procedures described above with reference to FIG. 3(D)~FIG. 5(A), first resin insulation layer 30, first conductive layer 34, via conductor 36 and connection via conductor (36A) are formed. Second resin insulation layer (50A) and second conductive layer (58A) are formed on first resin insulation layer 30. First conductive layer 34 and second conductive layer (58A) are connected by via conductor (60A). Third resin insulation layer (50B) and third conductive layer (58B) are formed on second resin insulation layer (50A). Second conductive layer (58A) and third conductive layer (58B) are connected by via conductor (60B). Fourth resin insulation layer (50C) and fourth conductive layer (58C) are formed on third resin insulation layer (50B). Third conductive layer (58B) and fourth conductive layer (58C) are connected by via conductor (60C). Solder-resist layer 70 with opening 71 is formed on fourth resin insulation layer (50C). Electroless plating is performed to form Ni film 72 and Au film 74 in opening 71 (FIG. 19(B)). Laminated substrate 1000 is completed. Since the subsequent steps are the same as in the first embodiment, their descriptions are omitted here.

When an electronic component is embedded in a resin insulation layer, warping is likely to occur in the resin insulation layer at the peripheries of the highly rigid electronic component made of silicon, causing a printed wiring board at normal temperature to warp in a shape with lowered peripheries and at high temperature to warp in a shape with raised peripheries. Accordingly, connection reliability is thought to decrease when another electronic component or a second printed wiring board is mounted on the printed wiring board.

A printed wiring board according to an embodiment of the present invention has an electronic component built-in and exhibits a smaller degree of warping.

A printed wiring board according to an embodiment of the present invention is characterized by having the following: a first insulation layer having a main surface and a secondary surface opposite the main surface; an electronic component built into the first insulation layer; a second insulation layer having a via conductor and positioned on the main surface of the first insulation layer; a third insulation layer having a via conductor and positioned on the second insulation layer; and a conductive film provided on the back surface of the electronic component, which is on the secondary-surface side of the first insulation layer. In such a printed wiring board, the coefficient of thermal expansion of the first insulation layer is set to be higher than that of the second insulation layer.

In a printed wiring board according to an embodiment of the present invention, the CTE of a first insulation layer with an embedded electronic component is higher than that of a second insulation layer formed on the first insulation layer. Since the first insulation layer has a higher CTE, warping at high temperature occurs in a direction that lowers the peripheral sides of the first insulation layer, thus offsetting the warping in a direction that raises the peripheral sides of the second insulation layer. At normal temperature, warping occurs in a direction that raises the peripheral sides of the first insulation layer, thus offsetting the warping in a direction that lowers the peripheral sides of the second insulation layer. Accordingly, the degree of warping in the printed wiring board is made smaller. Moreover, since conductive film is provided on the back surface of the electronic component, which is on the secondary-surface side of the first insulation layer, the difference decreases between the area of conductors on the secondary-surface side of the first insulation layer, where a smaller amount of conductors is formed, and the area of conductors on the second and third insulation layers. Thus, warping caused by the difference in the areas of the conductors is reduced. Accordingly, reliability is enhanced when an electronic component or a second printed wiring board is mounted on the printed wiring board.

In each of the embodiments above, a printed wiring board with a built-in electronic component was described as an example. However, it is an option for each printed wiring board to accommodate multiple electronic components. In addition, instead of active components such as an IC chip, it is another option to accommodate passive components such as a chip capacitor.

Obviously, numerous modifications and variations of the present invention are possible in light of the above teachings. It is therefore to be understood that within the scope of the appended claims, the invention may be practiced otherwise than as specifically described herein.

What is claimed is:
1. A printed wiring board, comprising:
a first insulation layer;
an electronic component built into the first insulation layer;
a second insulation layer having a via conductor and formed on a first surface of the first insulation layer; and
a conductive film formed on the first insulation layer on an opposite side with respect to the first surface of the first insulation layer such that the conductive film is positioned to face a back surface of the electronic component, wherein the first insulation layer has a coefficient of thermal expansion which is set higher than a coefficient of thermal expansion of the second insulation layer, and the first insulation layer has a first recessed portion and a second recessed portion on a second surface of the first insulation layer on the opposite side with respect to the first surface of the first insulation layer such that the first recessed portion is configured to accommodate the conductive film and the second recessed portion is configured to accommodate an external connection pad.

2. A printed wiring board according to claim 1, wherein the conductive film has a surface having an area which is greater than an area of the back surface of the electronic component.

3. A printed wiring board according to claim 1, further comprising:
a third insulation layer having a via conductor and positioned on the second insulation layer,
wherein the coefficient of thermal expansion of the first insulation layer is set higher than a coefficient of thermal expansion of the third insulation layer.

4. A printed wiring board according to claim 3, wherein the coefficient of thermal expansion of the first insulation layer is set in a range of 1.5 to 3 times higher than the coefficient of thermal expansion of the second insulation layer and the coefficient of thermal expansion of the third insulation layer.

5. A printed wiring board according to claim 1, further comprising:
an adhesive layer between the electronic component and the conductive film.

6. A printed wiring board according to claim 5, wherein the adhesive layer comprises one of a conductive adhesive agent and an insulative adhesive agent.

7. A printed wiring board according to claim 1, wherein the first recessed portion is formed such that the conductive film is recessed with respect to the second surface of the first insulation layer.

8. A printed wiring board according to claim 1, wherein the first recessed portion is formed such that the conductive film forms a surface which is on a same plane as the second surface of the first insulation layer.

9. A printed wiring board according to claim 1, wherein the first recessed portion is formed such that the conductive film is protruding from the second surface of the first insulation layer.

10. A printed wiring board according to claim 7, wherein the conductive film comprises a copper layer having a surface undergone a surface treatment.

11. A printed wiring board according to claim 7, wherein the conductive film comprises a copper layer, a nickel layer and a gold layer.

12. A printed wiring board according to claim 7, further comprising:
an external connection pad positioned in the second recessed portion, wherein the conductive film and the external connection pad form surfaces on a same plane.

13. A printed wiring board according to claim 8, wherein the conductive film comprises a copper layer, a nickel layer and a gold layer, and the copper layer has a surface undergone a surface treatment.

14. A printed wiring board according to claim 8, wherein the conductive film comprises a copper layer, a nickel layer, a gold layer and a copper layer, and one of the copper layers has a surface forming an outer surface of the conductive film and undergone a surface treatment.

15. A printed wiring board according to claim 1, wherein the conductive film forms a ground layer.

16. A printed wiring board according to claim 3, wherein the first insulation layer has a thickness which is greater than a thickness of the second insulation layer and a thickness of the third insulation layer.

17. A printed wiring board according to claim 16, wherein the thickness of the first insulation layer is in a range of 50 μm to 250 μm.

18. A printed wiring board according to claim 1, wherein the electronic component has a thickness which is in a range of 30 μm to 200 μm.

19. A printed wiring board according to claim 1, wherein the electronic component is a semiconductor component having a redistribution wiring layer.

20. A printed wiring board according to claim 5, wherein the electronic component is a power supply component.

21. A printed wiring board according to claim 1, further comprising:
a fourth insulation layer having a via conductor and formed on the second surface of the first insulation layer; and
a fifth insulation layer having a via conductor and formed on the fourth insulation layer.

* * * * *